United States Patent [19]
Hasegawa et al.

[11] Patent Number: 5,665,984
[45] Date of Patent: Sep. 9, 1997

[54] LIGHT-EMITTING DIODE

[75] Inventors: Koichi Hasegawa; Isao Kabe, both of Chichibu, Japan

[73] Assignee: Showa Denko K.K., Tokyo, Japan

[21] Appl. No.: 705,095

[22] Filed: Aug. 29, 1996

[30] Foreign Application Priority Data

Aug. 29, 1995 [JP] Japan .................. 7-220684

[51] Int. Cl.$^6$ .................................. H01L 33/00
[52] U.S. Cl. .................. 257/94; 257/96; 257/97; 257/101
[58] Field of Search .................. 257/94, 96, 97, 257/101

[56] References Cited

U.S. PATENT DOCUMENTS

| | | | |
|---|---|---|---|
| 3,914,785 | 10/1975 | Ketchow | 257/96 |
| 5,323,027 | 6/1994 | Yamada et al. | 257/94 |
| 5,432,359 | 7/1995 | Sekiwa et al. | 257/94 |

FOREIGN PATENT DOCUMENTS

| | | |
|---|---|---|
| 60-206184 | 10/1985 | Japan . |
| 6-21507 | 1/1994 | Japan . |

OTHER PUBLICATIONS

"High–efficiency Graded–band–gap $GA_{1-x}Al_xAs$ Light-–emitting Diodes"; Dawson, Ralph L.; Journal of Applied Physics, vol. 48, No. 6; Jun. 1977.

*Primary Examiner*—Ngan V. Ngo
*Assistant Examiner*—Allan R. Wilson
*Attorney, Agent, or Firm*—Armstrong, Westerman, Hattori, McLeland & Naughton

[57] ABSTRACT

A light-emitting diode comprises a first layer of Si-doped N-type $Ga_{1-x}Al_xAs$, a second layer of Si-doped P-type $Ga_{1-y}Al_yAs$ and a third layer of P-type $Ga_{1-z}Al_zAs$, in that order, in which the first and third layers have a higher Al concentration than the second layer, an Al concentration in the second layer decreases going from a first layer side to a third layer side, an Al concentration in a portion of the second layer in contact with the third layer is higher than an Al concentration value in a portion of the second layer in contact with the first layer minus 0.06, the second layer is formed to a thickness of approximately 8 μm to 50 μm, and light emission is via the first layer.

7 Claims, 4 Drawing Sheets

LIGHT-EMITTING DIODE

BACKGROUND OF THE INVENTION

1. Field of the Invention

The present invention relates to a light-emitting diode for use as a light source in a photocoupler, remote control or other such application requiring high-output infrared light.

2. Description of the Prior Art

There are currently known infrared light-emitting diodes such as the Si-doped GaAlAs type described on pages 2485 to 2492 of the Journal of Applied Physics, Vol. 48, No. 6, Jun. 1977, illustrated in FIG. 1(a). It is fabricated by a method comprising epitaxially growing GaAlAs layers on a GaAs single crystal substrate 4 by contacting a Si-doped GaAlAs solution with the substrate, cooling the solution. Selecting appropriate growth temperatures at this time makes possible the continuous formation of an N-type $Ga_{1-x}Al_xAs$ layer 1 and a P-type $Ga_{1-y}Al_yAs$ layer 2 using a single solution. The reason for this is that at a high temperature, Si, a group IV element, enters the GaAlAs single crystal at a group III element Ga (Al) site, while at a low temperature the entry takes place at a group V element As site. Use of a ramp cooled growth method is economical, as it allows the number of solutions to be reduced. Moreover, because this method does not require that the PN junction faces be exposed to an atmosphere in a furnace, there are fewer crystal defects. Light-emitting diodes are processed from this epitaxial wafer by etching away the GaAs substrate with a suitable etchant.

With the ramp coiled growth method, the Al concentration in each layer in the direction of layer growth is not constant, but decreases as growth proceeds from the initiation point to the completion point. The reason for this is that, since the segregation coefficient of Al is greater than 1, the concentration of Al in the solution decreases during layer growth formation. Also, the higher the Al concentration W is, the larger the bandgap of the $Ga_{1-w}Al_wAs$ mixed crystal. Thus, as shown in FIG. 1(b), Al concentration, that is bandgap, in the light-emitting diode of. FIG. 1(a) is a constant decrease from the growth initiation point of the first layer to the growth termination point of the second layer. In the first layer the Al concentration is highest at the surface (X1) and lowest at the interface between the first and second layers (X2). In the second layer, the Al concentration is highest at the interface between the first and second layers (Y1) and lowest at the surface (Y2). To enable the first and second layers to be continuously grown using a single solution, at the interface between the first and second layers the Al concentration in both layers is the same (X2=Y1).

Light emitted by the light-emitting diode of FIG. 1(a) is produced mainly by electrons injected from the PN junction into the P-type second layer recombining with holes. The energy of the emitted light is more or less equal to the crystal bandgap at the recombination site. Generally the light is of a type whereby it is absorbed by crystal having a smaller bandgap than the energy of the light. Therefore, the first layer of the light-emitting diode of FIG. 1(a) is transparent to the emitted light. In the second layer, regions 9 and 10 on the surface side of the second layer relative to the radiative recombination center 7 at which light is emitted by recombination are absorbing portions, and the interface side 8 between the first and second layers is transparent.

In the conventional light-emitting diode shown in FIG. 1(a), the regions 9 and 10 between the radiative recombination center 7 and the surface of the second layer are light absorbing portions. Even within the absorbing portions, the closer the portion in the region 10 is to the surface, the lower the Al concentration and the higher the light absorption factor.

To suppress light absorption, methods of increasing the external light output efficiency have been proposed comprising providing over the GaAlAs p-n junction a P-type GaAlAs window layer having a higher bandgap energy than the P-type GaAlAs constituting the emission layer (Japanese Patent Public Disclosures SHO 60-206184 and HEI 6-21507).

Each of these utilizes the spontaneous inversion of Si to form the PN junction, over which a P-type GaAlAs window layer with a bandgap that is larger than that of the P-type GaAlAs emission layer is formed, with the Al concentration in each layer being limited to within a prescribed range so as to raise the emission efficiency. Each also uses the emitted light passing through the P-type GaAlAs window layer.

However, while conventional light-emitting diodes such as these are used in the light-emitting sections of remote controls and the like, there is a market demand for higher-power products.

Thus, the object of the present invention is to provide a light-emitting diode having a high emission efficiency and a low forward voltage in which output is improved by suppressing the absorption of emitted light by epitaxially grown layers.

SUMMARY OF THE INVENTION

To attain the above object, the present invention employs a way of improving external light output efficiency, especially by limiting the Al concentration and thickness of a P-type GaAlAs layer forming the emission layer, and designating the direction in which the light is emitted.

That is, the light-emitting diode according to the present invention comprises forming a first layer of Si-doped N-type $Ga_{1-x}Al_xAs$, a second layer of Si-doped P-type $Ga_{1-y}Al_yAs$ and a third layer of P-type $Ga_{1-z}Al_zAs$, in that order, in which the first and third layers have a higher Al concentration than the second layer, an Al concentration in the second layer decreases going from a first layer side to a third layer side, an Al concentration in a portion of the second layer in contact with the third layer is higher than an Al concentration value in a portion of the second layer in contact with the first layer minus 0.06, and more preferably is higher than said value minus 0.03 after forming the second layer to a thickness of approximately 8~50 μm, and light emission is via the first layer.

As described, a high emission-efficiency and low forward-voltage light-emitting diode is obtained in which the optical output is improved by suppressing absorption of emitted light, through the synergistic effects of adjusting the Al concentration of each layer, forming the second layer to a thickness of approximately 8~50 μm and using the first layer as the light emission surface.

Further objects and features of the invention will be more apparent from the accompanying drawings and following detailed description of the invention.

DESCRIPTION OF THE PREFERRED EMBODIMENT

Figure 2B:
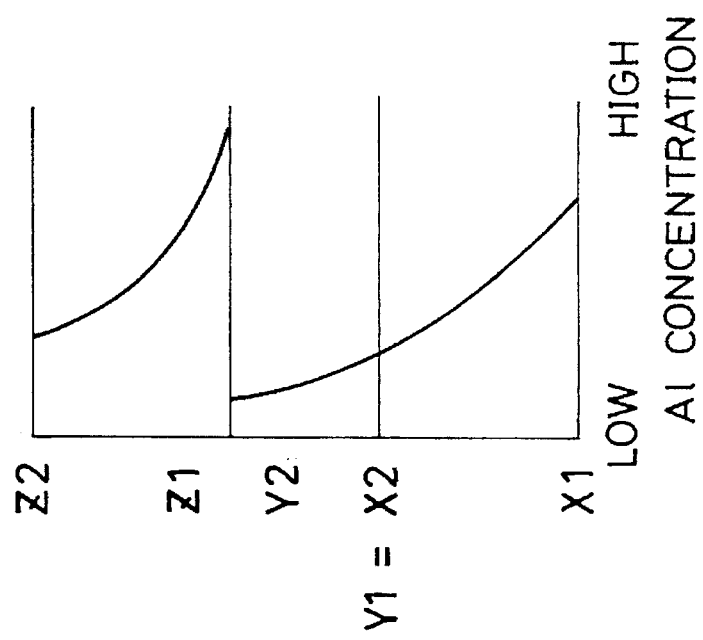
FIG. 2(b) shows the Al concentration profile of the light-emitting diode of FIG. 2(a)
Figure 2A:
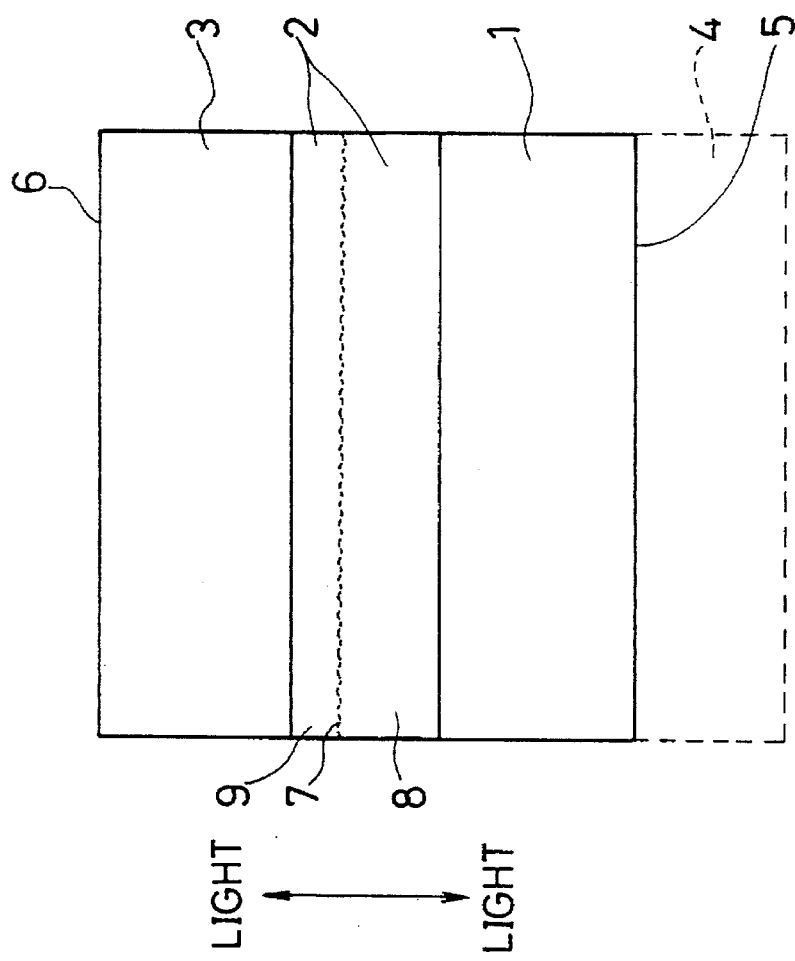
FIG. 2(a) is a cross-sectional view of the structure of an example of the infrared light-emitting diode of the present invention.

FIG. 2(a) shows an embodiment of a light-emitting diode according to the present invention, in which 4 is a substrate, which can be formed of N-type GaAs, which is easy to obtain. The growth orientation of substrate 4 is not particularly limited, and may for example be in the (100) plane.

Utilizing the spontaneous inversion of Si, a first layer of N-type $Ga_{1-x}Al_xAs$ and a second layer of P-type $Ga_{1-y}Al_yAs$ are epitaxially grown on the substrate 4 to form a PN junction. Since the segregation coefficient of Al is greater than 1, the concentration of Al in the epitaxial layer decreases as layer growth proceeds. As the wavelength of light emitted by GaAlAs is determined by the Al concentration in the P-type $Ga_{1-y}Al_yAs$ layer constituting the emission layer, first the Al concentration in the P-type $Ga_{1-y}Al_yAs$ second layer 2 is set, after which the Al concentration in the N-type $Ga_{1-x}Al_xAs$ first layer 1 at the time at which growth of the first layer is started is set, taking into account the segregation coefficient of the Al.

As a light-emitting diode for a remote control is usually required to have a wavelength of 860–950 nm, the Al mixing ratio y in the P-type $Ga_{1-y}Al_yAs$ second layer 2 is set at 0–0.1.

The concentration of Al from the start of growth of the N-type $Ga_{1-x}Al_xAs$ first layer 1 to the completion of growth of the P-type $Ga_{1-y}Al_yAs$ second layer 2 is determined by the initial Al concentration of the epitaxy solution, the growth starting temperature, the cooling rate, and so forth. As such, although the initial Al concentration of the epitaxy solution can be set by referring to an Al concentration profile obtained by measurements performed beforehand, the Al concentration may be set at 0.2–0.8, which is the initial concentration normally used.

To raise the light output efficiency, in addition to maintaining the Al mixing ratio in the P-type $Ga_{1-y}Al_yAs$ second layer 2 to within a constant range, changing the Al concentration in the second layer is important. To further reduce internal absorption within the second layer, it is necessary to reduce the difference between the concentration of Al in the region of the second layer in contact with the first layer, which is the region in the vicinity of the emission region, and the concentration of the Al in the region of the second layer in contact with the third layer, which is the region in the vicinity of the absorption region.

As shown in FIG. 2(b), X1 is the Al mixing ratio x at the interface of the N-type $Ga_{1-x}Al_xAs$ first layer 1 with the substrate 4, X2 (=Y1) is the Al mixing ratio x at the interface of first layer one with the second layer (P-type $Ga_{1-y}Al_yAs$ layer) 2, and Y2 is the Al mixing ratio y at the surface of the P-type $Ga_{1-y}Al_yAs$ second layer 2. It was found that the Al mixing ratio differential in the second layer, that is (Y1–Y2), had a major influence on the light output. It is preferable not to have too large an Al mixing ratio differential in the second layer.

Figure 3:
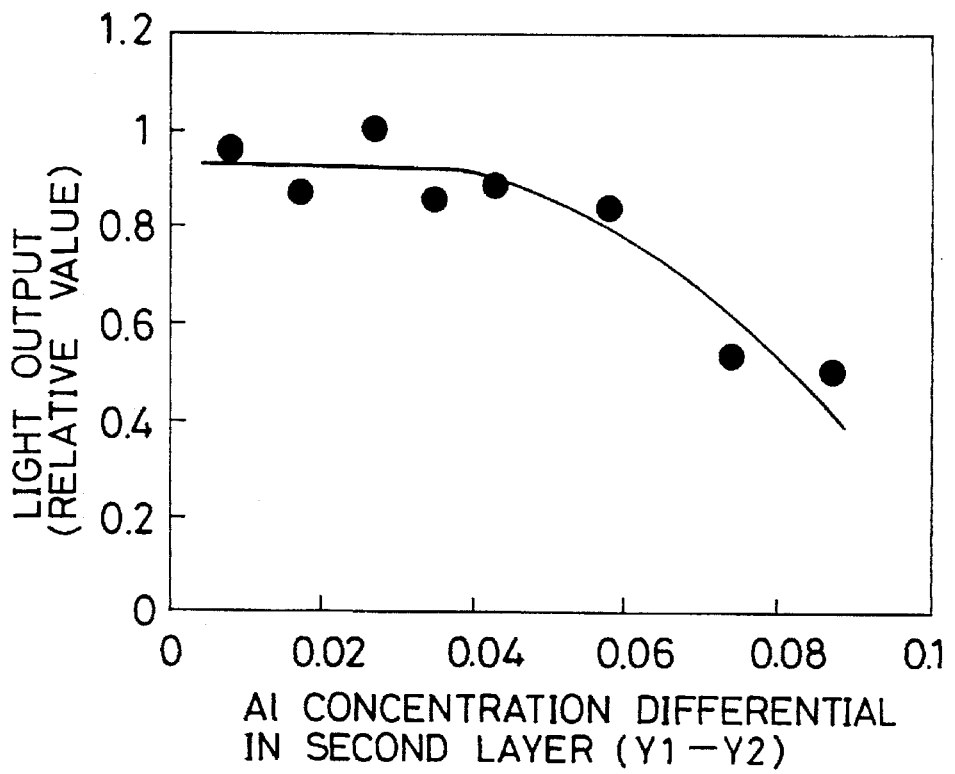
FIG. 3 is a graph showing the relationship between light output and the Al concentration differential in the second layer of the light-emitting diode of the invention.

That is, eight types of light-emitting diode were fabricated by maintaining the second layer at a more or less constant thickness by adjusting the amount of the solution and using the temperature at which the wafer was drawn from the melt container to vary the Al concentration Y2 at the second layer growth termination point. FIG. 3 shows the relationship between the Al concentration differential in the second layer (Y1–Y2) and emission output in these diodes. From FIG. 3, it can be seen that the emission output is high when the second layer Al concentration differential (Y1–Y2) is smaller than 0.06. When the differential is smaller than 0.03 which is preferable, it can be seen that the emission output is even higher. Further reduction of the differential did not produce an improvement in emission output. While this is thought to be due to the type of process that gives rise to light emission, the type of process that gives rise to light absorption and the proportion thereof, the precise details are unclear.

Figure 4:
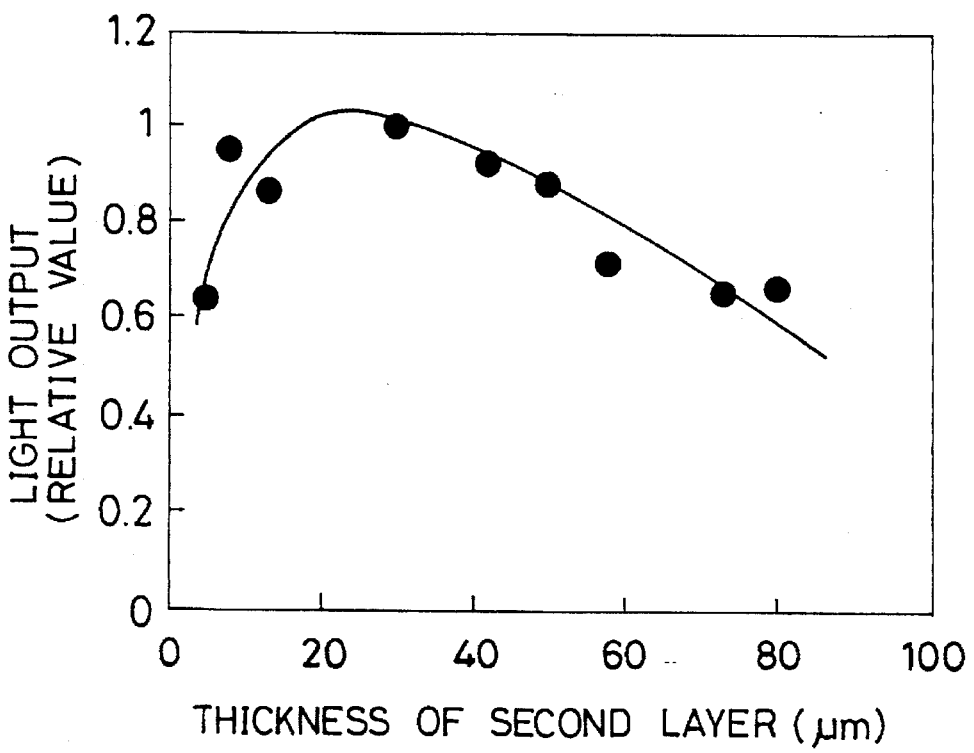
FIG. 4 is a graph showing the relationship between light output and the thickness of the second layer in the light-emitting diode of the invention.

The second layer only needs to be of a thickness that is the same as the diffusion length of injected carriers, when light emission is based on Si. However, with a layer that is thinner than 8 μm, there is a decrease in the number of electrons that can be confined in the second layer and an increase in electrons not contributing to light emission. If the second layer is thicker than 50 μm, the ratio of light absorbed in the second layer is increased. FIG. 4 shows the results of tests performed to examine the relationship between the thickness of the second layer and light emission output. The results shown in FIG. 4 were obtained by fabricating eight types of light-emitting diode by maintaining the Al concentration Y1 of the portion of the second layer in contact with the first layer at a constant level and the Al concentration Y2 of the portion of the second layer in contact with the third layer at a constant level, and using different amounts of solution to vary the thickness of the second layer. FIG. 4 reveals that emitted light output increased when the thickness of the second layer was from around at least 8 μm up to around no more than 50 μm. The second layer only needs to be of a thickness that is the same as the diffusion length of injected carriers; around 20–40 μm is a range that is easy to fabricate with liquid-phase epitaxy.

Figure 5:
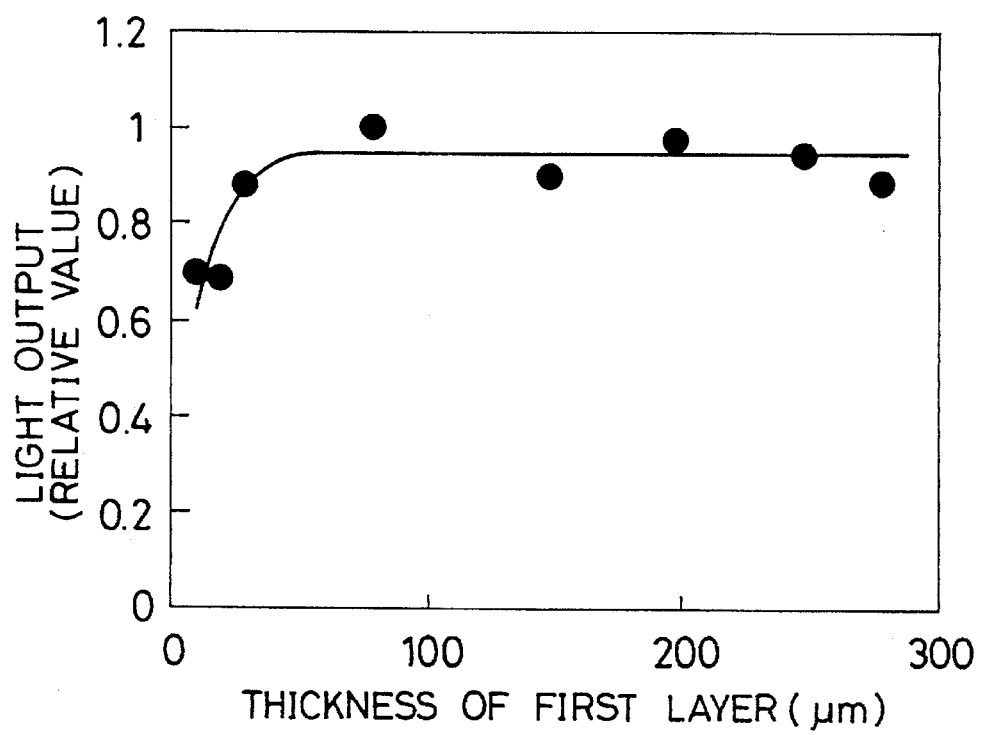
FIG. 5 is a graph showing the relationship between light output and the thickness of the first layer in the light-emitting diode of the invention.
Figure 6:
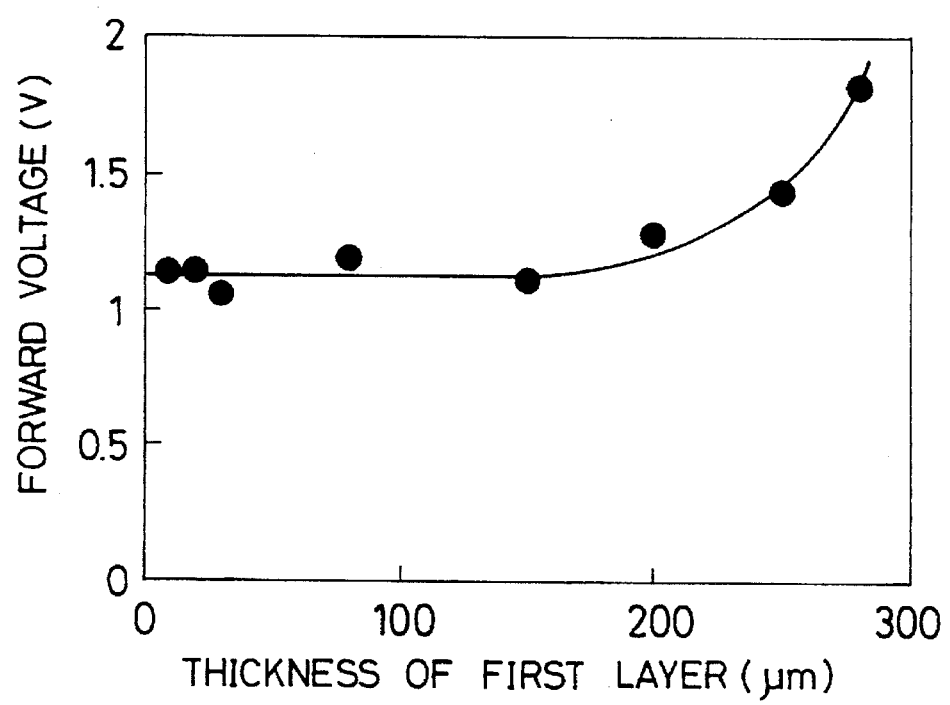
FIG. 6 is a graph showing the relationship between $V_F$ characteristics and the thickness of the first layer in the light-emitting diode of the invention.

Next, the temperature at which the wafer is immersed in the melt container was used to vary the thickness of the first layer to fabricate eight types of light-emitting diode. The relationship between the thickness of the first layer and light output and forward voltage $V_F$ is shown in FIGS. 5 and 6. $V_F$ is high when the first layer is thicker than about 200 μm, and light output is low when the layer is thinner than 30 μm. A first layer thickness that is from 30 μm to 200 μm is therefore preferable.

If the first layer is thinner than 30 μm, the current flowing between the first layer surface electrode and the PN junction will not spread out the device periphery, but will be concentrated at the center, resulting in a diode with a low light output and high electrical degradation. A first layer thickness of more than 200 μm increases the Al concentration differential through the first layer, because since the wavelength of the emitted light is determined by the Al concentration at the interface between the first and second layers, the Al concentration at the surface of the first layer is increased, increasing the electrical resistance between the surface electrode of the first layer and the first layer itself.

Taking the above points into consideration, after continuously forming the first and second layers that form the PN junction on the GaAs substrate, the P-type $Ga_{1-z}Al_zAs$ layer that forms the third layer is grown epitaxially. This P-type $Ga_{1-z}Al_zAs$ third layer serves to confine injected electrons in the second layer, the emission layer, and, through total reflection at the surface, also serves to return the emitted light to the side from which the light exits, for which the layer has to be transparent to the emitted light. For this purpose, the Al mixing ratio z of the P-type $Ga_{1-z}Al_zAs$ third layer has to be sufficiently higher than y. On the other hand, a third layer Al mixing ratio that is too high makes it difficult to form good ohmic electrodes. Thus, an Al mixing ratio z that is higher than y with an upper limit of around 0.7 is appropriate.

A third layer thickness of several micrometers is preferable, as this allows the carrier confinement effect to be manifested and the thinness means that less light is absorbed. However, if the third layer thickness is less than 60 μm, when an N-side-up diode is incorporated into a lamp, a short circuit can occur across the interface between the second and third layers. That is, surface tension usually causes the conductive paste used to bond the diode and stem to spread to the sides of the diode, and if it reaches the interface between the second and third layers, it nullifies the electron confinement effect in order to prevent this, the third layer has to be at least 60 μm thick.

The third layer is a P-type, the same as the emission layer. There is no particular limitation on the P-type dopant used, with Si, Zn, Mg, Cd and the like being applicable.

The decrease in the amount of light internally absorbed by the second layer is one reason why the light-emitting diode of this invention has a higher light output than conventional light-emitting diode. There is also the fact that since the third layer has a larger bandgap than the second layer, electrons injected into the second layer from the first layer do not diffuse into the third layer but are confined in the second layer, increasing the probability of light-emitting recombinations in the second layer.

A further point is that the present invention uses an N-side-up N-type $Ga_{1-x}Al_xAs$ first layer 1 as the surface from which the light is emitted.

Using an N-side-up type first layer surface as the light emission surface (upper surface) provides a higher light output than light emission surface constituted by a P-side-up third layer (upper surface). The reason for this is as follows.

In the case of an N-side-up arrangement (that is, with reference to FIG. 2(a), when light is emitted downward), of the light generated at the radiative recombination center 7 in the second layer, the downward component reaches the diode surface via transparent portion 8 of the second layer and the (transparent) first layer 1. Part of the upward component is absorbed by a light-absorbing portion 9 of second layer 2 and passes through the (transparent) third layer to the diode surface, where it is reflected downward, passing via the third layer, the light-absorbing portion 9 of the second layer, where it is again partially absorbed, and the first layer, thereby exiting from the diode surface.

In the case of a P-side-up arrangement (that is, with reference to FIG. 2(a), when light is emitted upward), the upward component reaches the diode surface via the light-absorbing portion 9 of the second layer 2, where it is partially absorbed, and the third layer 3. The downward component passes via the transparent portion of the second layer and the (transparent) first layer to the lower surface of the diode, where it is reflected back through the first layer, the light-absorbing portion 9 of the second layer, where it is again partially absorbed, and the third layer, and exits from the diode surface.

Using calculations to compare the intensities of the light thus emitted provides the following results. Of the light generated in the second layer, if L is the intensity of the light component emitted perpendicular to the epitaxial plane and in the direction toward the emission surface, and L is also the intensity of the component in the opposite direction to the emission surface, σ is the optical transmissivity of the second layer, ν is the optical reflectance at the lower surface of the diode, L1 is the intensity of light emitted from the N-side-up upper surface, and L3 is the intensity of light emitted from the P-side-up upper surface, the difference between the intensities is $$L1-L3=(L+\sigma\nu\sigma L)-(\sigma L+\sigma\nu L)=L(1-\sigma)(1-\sigma\nu)>0 \quad (1)$$

$$(\because <\sigma<1,\ 0<\nu<1) \quad (2)$$

The N-side-up configuration provides a higher emission efficiency than the P-side-up arrangement, the N-side-up not having a light absorbing portion between the light generation portion 7 and the light emission surface. Here, light components parallel to the epitaxial plane and light reflected by the upper surface of the diode are ignored, but taking them into account would not change the result.

In this invention, an N-side-up device is fabricated by removal of GaAs substrate from an epitaxial wafer fabricated as described above. This can be done by using a normal ammonia-based etchant to etch away the GaAs substrate. The total thickness of the three epitaxially grown layers is 100 μm or more, so removing the GaAs substrate does not cause any problem with respect to subsequent processing.

Next, metal deposition is used to form an ohmic contact on the surface of the third layer of the wafer from which the substrate has been removed, and conductive paste is used to bond the stem surface thereto, with the third layer facing downward. Deposition of metal is also used to form an ohmic electrode on the surface of the first layer connected with gold wire, to form the light-emitting diode.

In accordance with the invention, internal absorption of emitted light is minimized by limiting the Al mixing ratio in each of the GaAlAs layers that make up the light-emitting portion. In particular, internal light output efficiency and external light output efficiency were further raised by prescribing the thickness and Al concentration of the P-type GaAlAs layer forming the light-emitting portion, and by using an N-side-up N-type GaAlAs layer in the direction from which the light is emitted.

Embodiments of the present invention will now be described together with comparative examples. However, it is to be understood that the invention is not limited to the embodiments described below.

Embodiment 1

An example will be described of a light-emitting diode fabricated according to the present invention by a dip system liquid-phase epitaxial ramp cooled growth method. The (100) plane of N-type GaAs was used as the substrate. A first melt container was charged with appropriate amounts of Ga, GaAs, Al and Si, and a second melt container was charged with appropriate amounts of Ga, GaAs, Al and Zn. First, all the material in the first melt container was completely melted, the substrate was immersed at 880° C. and the temperature was cooled to 840° C. to grow a first layer (N) and a second layer (P) by using the spontaneous inversion of Si. The low amount of crystal precipitation makes it difficult to grow a layer from 840° C. having a thickness of 60 μm or more, so a third layer was grown by reheating the furnace to immerse the wafer in the second melt container at 900° C., and then cooling to 780° C.

The wafer thus obtained was evaluated, and it was found that the first layer was 80 μm, the second layer 30 μm and the third layer 150 μm. Al concentrations were X1=0.315, X2=Y1=0.078, Y2=0.051, Z1=0.434, and Z2=0.147. To process the wafer to form a diode, the substrate was removed by immersion in an ammonia-based etchant. Electrodes were formed by forming 130 μm diameter circles on the surface of the first layer and 100 μm diameter dots at a pitch of 150 μm on the surface of the third layer. The diodes formed measured 325 μm square. Conductive paste was used to bond diodes on conductive stems, with the third layer inverted, and gold wire was used to connect to the electrode on the first layer. The light output of the light-emitting diode when a current of 20 mA was applied was measured. The peak wavelength of the emitted light was 883 nm.

(Comparative example 1)

Figure 1B:
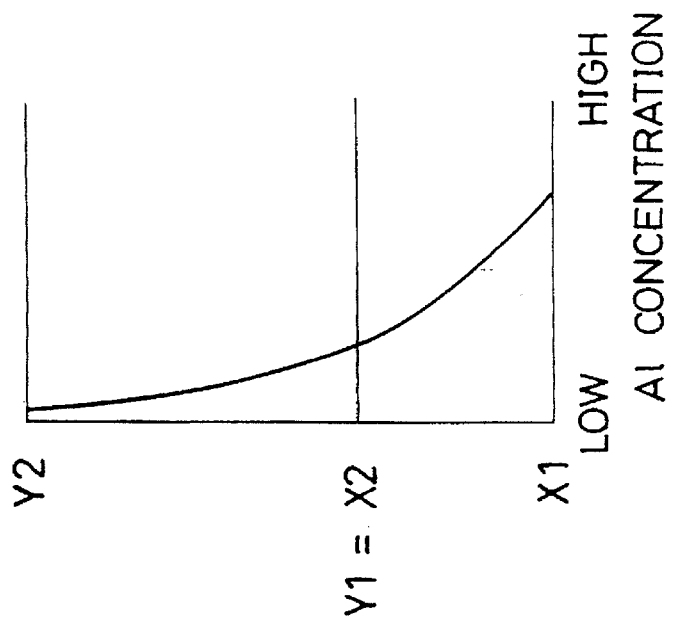
FIG. 1(b) shows the Al concentration profile of the light-emitting diode of FIG. 1(a)
Figure 1A:
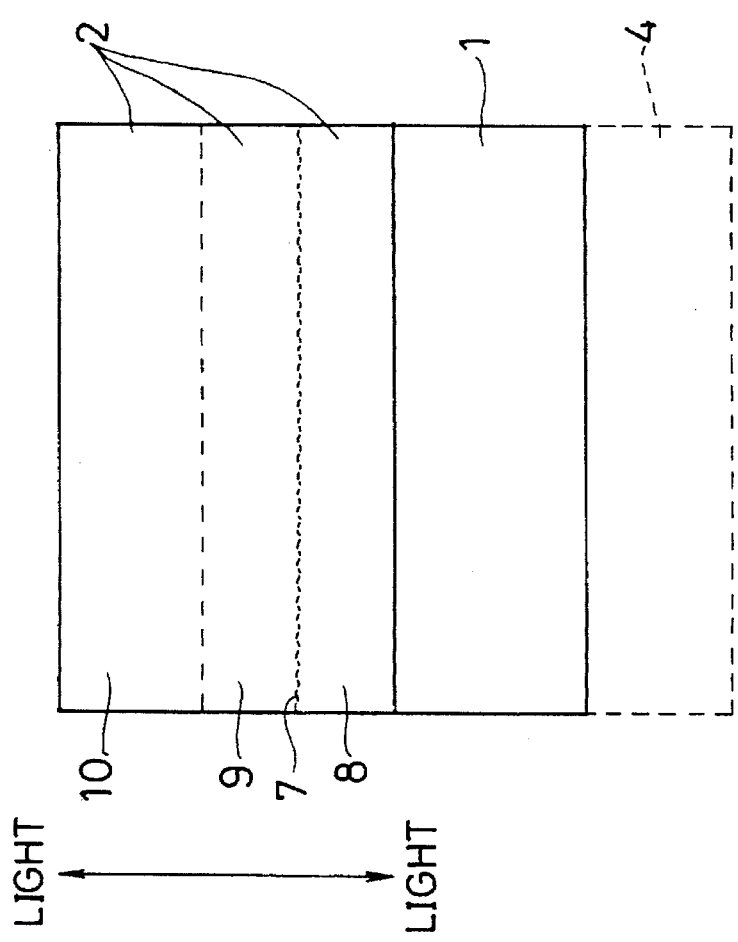
FIG. 1(a) is a cross-sectional view of the structure of a conventional infrared light-emitting diode.

The example of the conventional light-emitting diode shown in FIG. 1(a) will be described. A substrate was immersed in the first melt container of the above-described embodiment at 880° C., cooled to 780° C. to continuously grow first and second layers, and separated. The substrate was removed from the wafer, and with the first layer as the upper surface, a light-emitting diode was produced using the same process as the embodiment of the invention. Taking 1 as the light output of the diode of the above embodiment, the output of this diode was 0.41. The output of the light-emitting diode of this comparative example was lower than the output of the light-emitting diode of the embodiment.

(Comparative example 2)

While in the light-emitting diode of the embodiment the light was emitted from the first layer side, with the diode using an N-side-up polarity, the wafer was processed with the sides reversed to fabricate a P-side-up diode in which the light was emitted from the third layer. Taking 1 as the light output of the diode of the embodiment, the light output of this P-side-up diode was 0.67. The output of the P-side-up diode of this comparative example was lower than the output of the N-side-up diode of the embodiment.

As is clear from the foregoing description, in accordance with the present invention, an infrared light-emitting diode is obtained that is economical, being produced using the spontaneous inversion of Si, and having low internal absorption, provides a high output.

What is claimed is:

1. A light-emitting diode comprising a first layer of Si-doped N-type $Ga_{1-x}Al_xAs$, a second layer of Si-doped P-type $Ga_{1-y}Al_yAs$ and a third layer of P-type $Ga_{1-z}Al_zAs$, in that order, in which the first and third layers have a higher Al concentration than the second layer, an Al concentration in the second layer decreases going from a first layer side to a third layer side, an Al concentration in a portion of the second layer in contact with the third layer is higher than an Al concentration value in a portion of the second layer in contact with the first layer minus 0.06 or less, the second layer is formed to a thickness of approximately 8 μm or more to approximately 50 μm or less, and light emission is via the first layer.

2. The light-emitting diode according to claim 1, wherein thickness of the first layer is from approximately 30 μm or more to approximately 200 μm or less.

3. The light-emitting diode according to claim 1, wherein thickness of the third layer is not less than 60 μm.

4. The light-emitting diode according to claim 3, wherein thickness of the first layer is from approximately 30 μm or more to approximately 200 μm or less.

5. The light-emitting diode according to claim 1, wherein an Al concentration in a portion of the second layer in contact with the third layer is higher than an Al concentration value in a portion of the second layer in contact with the first layer minus 0.03.

6. The light-emitting diode according to claim 2, wherein an Al concentration in a portion of the second layer in contact with the third layer is higher than an Al concentration value in a portion of the second layer in contact with the first layer minus 0.03.

7. The light-emitting diode according to claim 3, wherein an Al concentration in a portion of the second layer in contact with the third layer is higher than an Al concentration value in a portion of the second layer in contact with the first layer minus 0.03.

* * * * *